United States Patent
Hara et al.

(10) Patent No.: US 7,354,890 B2
(45) Date of Patent: Apr. 8, 2008

(54) CLEANING COMPOSITION AND METHOD

(75) Inventors: Yasushi Hara, Shunan (JP); Fumiharu Takahashi, Shunan (JP); Hiroaki Hayashi, Hikari (JP); Akinori Shimono, Shunan (JP)

(73) Assignee: Tosoh Corporation, Yamaguchi-ken (JP)

( * ) Notice: Subject to any disclaimer, the term of this patent is extended or adjusted under 35 U.S.C. 154(b) by 255 days.

(21) Appl. No.: 11/203,377

(22) Filed: Aug. 15, 2005

(65) Prior Publication Data

US 2006/0040839 A1  Feb. 23, 2006

(30) Foreign Application Priority Data

Aug. 19, 2004  (JP) .............................. 2004-239200

(51) Int. Cl.
 *C11D 7/50*  (2006.01)
(52) U.S. Cl. ..................... 510/175; 134/1.3; 438/692
(58) Field of Classification Search ..................... None
 See application file for complete search history.

(56) References Cited

U.S. PATENT DOCUMENTS

| | | | | |
|---|---|---|---|---|
| 3,728,188 | A * | 4/1973 | Yarrington et al. ......... | 216/101 |
| 5,516,496 | A * | 5/1996 | Slage .......................... | 423/20 |
| 5,797,987 | A * | 8/1998 | Rossio ..................... | 106/14.12 |
| 5,868,874 | A * | 2/1999 | Rossio ....................... | 148/262 |
| 5,976,265 | A * | 11/1999 | Sangeeta et al. ................ | 134/3 |
| 6,187,976 | B1 * | 2/2001 | Van Der Puy et al. ..... | 570/176 |
| 6,193,815 | B1 * | 2/2001 | Wada et al. ................. | 148/247 |
| 6,419,731 | B2 * | 7/2002 | Inbe et al. ................ | 106/14.44 |
| 6,494,960 | B1 * | 12/2002 | Macdonald et al. ........... | 134/3 |
| 2001/0050029 | A1 * | 12/2001 | Inbe et al. ................ | 106/14.44 |

FOREIGN PATENT DOCUMENTS

| | | |
|---|---|---|
| JP | 04-289866 A | 10/1992 |
| JP | 2003-330205 A | 11/2003 |

* cited by examiner

*Primary Examiner*—Gregory Webb
(74) *Attorney, Agent, or Firm*—Sughrue Mion, PLLC

(57) ABSTRACT

Cleaning compositions composed of specific amounts of carbonic acid and/or carbonate, hydrogen peroxide, aluminum fluoride and water are highly effective for cleaning electronic devices of resist, resist residues, titanium dioxide, aluminum oxide and silicon dioxide. The compositions contain no hydroxylamine and are thus free of its hazards.

9 Claims, No Drawings

CLEANING COMPOSITION AND METHOD

BACKGROUND OF THE INVENTION

1. Field of the Invention

The present invention relates to a cleaning composition and a cleaning method. More particularly, the invention relates to a composition and method for cleaning electronic devices.

2. Description of the Related Art

In semiconductor and liquid crystal display (LCD) manufacturing operations, unnecessary resist residues which remain following the developing and etching steps are either directly stripped with a resist stripper, or first ashed then stripped with a stripper.

Resist strippers include solutions for stripping resist residues without an ashing step, of which the most commonly used are compositions containing an alkanolamine (e.g., monoethanolamine) and the organic solvent; and solutions for stripping resist residues after ashing, typically a composition containing hydroxylamine. The common practice today is for ashing to precede the stripping operation, and for stripping to be carried out using primarily a hydroxylamine-containing composition as the resist stripper (see JP-A 4-289866).

However, hydroxylamine is explosive and thus dangerous to handle. This poses a problem for industrial use, and so there exists a desire for alternative materials.

Methods are known which involve the use of hydrogen peroxide and a carbonate or phosphate of ammonium as an alkanolamine and hydroxylamine-free resist stripper (e.g., see JP-A 2003-330205). To increase their resist stripping ability, it has been necessary for such resist strippers to have a high concentration of hydrogen peroxide. However, high-concentration hydrogen peroxide readily decomposes. To keep this from happening, a radical-trapping stabilizer must be added. Unfortunately, the resulting resist stripper often falls short of what is desired.

SUMMARY OF THE INVENTION

It is therefore an object of the present invention to provide cleaning compositions capable of cleaning electronic devices without including the dangerous chemical hydroxylamine. Another object of the invention is to provide cleaning methods which use such cleaning compositions.

We have conducted extensive studies on the cleaning of electronic devices. As a result, we have discovered that compositions composed of carbonic acid and/or carbonate, hydrogen peroxide, aluminum fluoride and water have an excellent cleaning ability, thereby completing the present invention.

DETAILED DESCRIPTION OF THE PREFERRED EMBODIMENTS

Accordingly, the invention provides cleaning compositions comprising carbonic acid and/or carbonate, hydrogen peroxide, aluminum fluoride and water In the cleaning compositions of the invention, "carbonic acid" refers to an aqueous solution of carbon dioxide, and "carbonate" refers to a salt of $H_2CO_3$. The salt may be a normal salt, an acidic salt (bicarbonate), or a basic salt. Carbonates generally can be obtained by reacting a metal oxide or hydroxide with carbon dioxide in the presence of water.

The carbonate used in the cleaning compositions of the invention is preferably one that is soluble in water. Examples of water-soluble carbonates include ammonium carbonate, alkali metal carbonates and tellurium carbonate. In applications where the presence of metal ions is undesirable (e.g., semiconductor fabrication), the use of ammonium carbonate is especially preferred. Examples of ammonium carbonate include salts of ammonia and carbonic acid, salts of amines and carbonic acid, and quaternary ammonium carbonates. Ammonium carbonate is generally available as mixtures of ammonium carbonate, ammonium bicarbonate and ammonium carbamate, and may be used in the form of such a mixture. An aqueous solution of ammonium carbonate decomposes to carbonic acid and ammonia at 70° C.; use in this form decomposed to carbonic acid and ammonia is also possible.

The cleaning composition of the invention includes hydrogen peroxide. No particular limitation is imposed on the hydrogen peroxide, which may be used alone or as a solution in water.

The aluminium fluoride used in the cleaning composition of the invention may be used in the form of aluminum trifluoride or may be used as a combination of aluminum and hydrofluoric acid.

The cleaning composition of the invention may include also a water-soluble organic solvent. The organic solvent used is not subject to any particular limitation. Illustrative examples include alcohols such as methanol, ethanol, propanol, butanol, ethylene glycol, propylene glycol, diethylene glycol, dipropylene glycol and glycerol; ethers such as tetrahydrofuran; amides such as dimethylformamide, dimethylacetamide, methylpyrrolidone and dimethylimidazolidinone; sulfoxides such as dimethylsulfoxide; amine oxides such as dimethyldodecylamine oxide and methylmorpholine oxide; organic nitriles such as acetonitrile, propionitrile, butyronitrile, isobutyronitrile, succinonitrile, benzonitrile, adiponitrile, valeronitrile and tolunitrile; and ether alcohols such as butoxypropanol, butoxyethanol, propoxypropanol, propoxyethanol, ethoxypropanol, ethoxyethanol, methoxypropanol, methoxyethanol, dipropylene glycol monobutyl ether, dipropylene glycol monopropyl ether, dipropylene glycol monoethyl ether, dipropylene glycol monomethyl ether, diethylene glycol monobutyl ether, diethylene glycol monopropyl ether, diethylene glycol monoethyl ether and diethylene glycol monomethyl ether. Ether alcohols and organic nitriles are especially preferred because they promote stripping of the resist. These may be used singly or as mixtures of two or more thereof. Although the amount in which the water-soluble organic solvent is used varies considerably depending on the intended application and the conditions of use, the content of the water-soluble organic solvent based on the total weight of the cleaning composition is preferably 0.1 to 70 wt %, and more preferably 1 to 50 wt %. At less than 0.1 wt %, the effects of adding the water-soluble organic solvent are insignificant, whereas at more than 70 wt %, further addition of the water-soluble organic solvent produces little additional improvement in the effect.

No particular limitation is imposed on the form of the water included in the cleaning composition of the invention. The water may be used by itself, in the form of a mixture such as with an organic solvent, or as an aqueous solution obtained by the addition of, for example, a salt, an acid or a base.

In the cleaning composition of the invention, the respective contents of the carbonic acid and/or carbonate, the hydrogen peroxide, the aluminum fluoride and the water can vary considerably depending on the intended application and the conditions of use. However, it is preferable, based on the total weight of the composition, for the content of carbonic acid and/or carbonate to be from 0.01 to 40 wt %, the content of hydrogen peroxide to be from 0.001 to 3.9 wt %, the content of aluminum fluoride to be from 0.01 to 100 ppm by weight, and the content of water to be from 25 to 99.9 wt %. It is more preferable for the content of carbonic acid and/or carbonate to be from 0.1 to 30 wt %, the content of hydrogen peroxide to be from 0.01 to 3.5 wt %, the content of aluminum fluoride to be from 0.1 to 60 ppm by weight, and the content of water to be from 39 to 99.9 wt %. At less than 0.01 wt % of carbonic acid and/or carbonate, the cleaning rate is so slow as to be impractical, whereas at more than 40 wt %, the carbonic acid and/or carbonate dissolves poorly in the aqueous solution, which is impractical. At less than 0.001 wt % (10 ppm) of hydrogen peroxide the cleaning rate is so slow as to be impractical, whereas at more than 3.9 wt % the hydrogen peroxide is highly hazardous and requires the use of a stabilizer, which is industrially impractical. At less than 0.01 ppm by weight of aluminum fluoride, the cleaning rate is so slow as to be impractical, whereas at more than 100 ppm by weight, the aluminum fluoride does not dissolve in water, making the composition industrially impractical. At less than 25 wt % of water, the carbonic acid dissolves poorly in the aqueous solution, whereas at more than 99.9 wt %, the cleaning rate becomes so low as to be impractical.

It is preferable to use the cleaning composition of the invention at a temperature of from 0 to 100° C. At less than 0° C., the cleaning rate may be so low as to be impractical, whereas at more than 100° C., the carbonic acid does not dissolve in water, lowering the cleaning ability of the composition.

Electronic devices can be cleaned using the cleaning compositions of the invention. In particular, the inventive compositions can clean off and remove organic materials such as resist and antireflective films that have been formed during electronic device fabrication and are no longer needed, resist residues that remain after ashing, and inorganic materials such as titanium oxide, aluminum oxide and silicon oxide.

Because the inventive cleaning compositions and method cause very little damage to aluminum metal, they are particularly effective for cleaning aluminum wiring semiconductors.

EXAMPLES

Examples are given below by way of illustrative and not be way of limitation. The following abbreviations are used in Table 1 below.
AC: Ammonium carbonate
HPO: Hydrogen peroxide
ALF: Aluminum fluoride
MeCN: Acetonitrile
DEG: Diethylene glycol
BP: Butoxypropanol Examples 1 to 9, Comparative Examples 1 to 3

A silicon wafer on which an antireflective film for KrF lasers had been formed was immersed for 2 minutes at 35° C. in an aqueous solution having the composition indicated in Table 1 (the balance in the compositions shown in Table 1 is water). The wafer was then rinsed with water and dried, after which the condition of the surface was examined. The results are presented in Table 1. The ability of the cleaning compositions to strip the antireflective film was rated as follows.

Excellent: Film was completely stripped
Good: Film was at least 90% stripped
Fair: Film was partially (<90%) stripped
Poor: Film was not stripped

TABLE 1

| | Composition (wt %, balance is water) | | | | | | |
|---|---|---|---|---|---|---|---|
| | AC | HPO | ALF | MeCN | DEG | BP | Strippability |
| EX 1 | 1 | 2.5 | 0.0002 | | | | Good |
| EX 2 | 1 | 1 | 0.0001 | | | | Fair |
| EX 3 | 1 | 0.5 | 0.0001 | | | 3 | Good |
| EX 4 | 0.2 | 1 | 0.0001 | | | 3 | Good |
| EX 5 | 5 | 1 | 0.0001 | | | 3 | Good |
| EX 6 | 1 | 1 | 0.0001 | 20 | | | Excellent |
| EX 7 | 1 | 1 | 0.0001 | 10 | | 2 | Excellent |
| EX 8 | 1 | 1 | 0.0002 | 5 | | 2 | Excellent |
| EX 9 | 1 | 1 | 0.0001 | 5 | 5 | 2 | Excellent |
| CE 1 | 1 | 2.5 | | | | | Poor |
| CE 2 | 1 | | 0.0002 | | | | Poor |
| CE 3 | | 2.5 | 0.0002 | | | | Poor |

Example 10

An aqueous solution containing 1 wt % ammonium carbonate, 1 wt % hydrogen peroxide and 2 ppm aluminum fluoride was prepared. Wafers having deposits thereon of silicon oxide, aluminum oxide and titanium oxide were immersed in the solution for 1 minute at 40° C., then rinsed in running water for 2 minutes. Upon examination of the surface with an electron microscope, the silicon oxide, aluminum oxide and titanium oxide were found to have been completely removed.

Comparative Example 4

An aqueous solution containing 1 wt % ammonium carbonate, 1 wt % hydrogen peroxide and 0.5 wt % ammonium fluoride was prepared. Wafers having deposits thereon of silicon oxide, aluminum oxide and titanium oxide were immersed in the solution for 1 minute at 40° C., then rinsed in running water for 2 minutes. Upon examination of the surface with an electron microscope, the aluminum oxide and titanium oxide were found to have been completely removed, but silicon oxide remained.

Example 11

A wafer on which an aluminum film had been formed by sputtering was immersed for 10 minutes at 40° C. in the same solution as in Example 10. The aluminum corrosion rate was measured and found to be 2 nm per minute.

Comparative Example 5

A wafer on which an aluminum film had been formed by sputtering was immersed for 10 minutes at 40° C. in the same solution as in Comparative Example 4. The aluminum corrosion rate was measured and found to be 31 nm per minute.

The invention claim is:

1. A cleaning composition comprising:
   (a) at least one carbonate selected from the group consisting of ammonium carbonate, ammonium bicarbonate and ammonium carbamate,
   (b) hydrogen peroxide,
   (e) aluminum fluoride, and
   (d) water.

2. A cleaning composition according to claim 1, wherein, based on the total weight of the composition, the content of the component a is 0.01 to 40 wt %, the content of the component (b) is 0.001 to 3.9 wt %, the content of the component (c) is 0.01 to 100 ppm by weight, and the content of the component (d) is 25 to 99.9 wt %.

3. A cleaning composition according to claim 1, further comprising a water-soluble organic solvent.

4. The cleaning composition according to claim 3, wherein, based on the total weight of the composition, the content of a water-soluble organic solvent is 0.1 to 70 wt %.

5. A cleaning composition according to claim 3, wherein the water-soluble organic solvent is an ether alcohol, an organic nitrile, or a combination of both.

6. A cleaning composition according to claim 5, wherein the ether alcohol is at least one selected from the group consisting of butoxypropanol, butoxyethanol, propoxypropanol, propoxyethanol, erhoxypropanol, ethoxyethanol, methoxypropanol, methoxyethanol, dipropylene glycol monobutyl ether, dipropylene glycol monopropyl ether, dipropylene glycol monoethyl ether, dipropylene glycol monomethyl ether, diethylene glycol monobutyl ether, diethylene glycol monopropyl ether, diethylene glycol monoethyl ether and diethylene glycol monomethyl ether.

7. A cleaning composition according to claim 5, wherein the organic nitrile is at least one selected from the group consisting of acetonitrile, propionitrile, butyronitrile, isobutyronitrile, succinonitrile, benzonitrile, adiponitrile, valeronitrile and tolunitrile.

8. A method of cleaning off from electronic devices, resist, resist residues, titanium oxide, aluminum oxide and silicon oxide, comprising the step of immersing said devices in the cleaning composition of claim 1.

9. A method according to claim 8, wherein said devices are aluminum wiring semiconductors.

* * * * *